United States Patent [19]

Muench et al.

[11] 4,404,126

[45] Sep. 13, 1983

[54] PREPARATION OF ELECTRICALLY CONDUCTIVE POLYMERIC SYSTEMS

[75] Inventors: Volker Muench, Ludwigshafen; Herbert Naarmann, Wattenheim; Klaus Penzien, Frankenthal, all of Fed. Rep. of Germany

[73] Assignee: BASF Aktiengesellschaft, Fed. Rep. of Germany

[21] Appl. No.: 278,668

[22] Filed: Jun. 29, 1981

[30] Foreign Application Priority Data

Jul. 19, 1980 [DE] Fed. Rep. of Germany ....... 3027529

[51] Int. Cl.³ .............................................. H01B 1/02
[52] U.S. Cl. ................................... 252/512; 252/500; 252/518; 524/439; 526/285
[58] Field of Search ................. 252/500, 512, 518; 357/8, 15; 524/439, 414; 528/487; 526/285

[56] References Cited

U.S. PATENT DOCUMENTS 4,204,216  5/1980  Heeger et al. ...................... 252/500
4,222,903  9/1980  Heeger et al. ...................... 252/518
4,269,738  5/1981  Pez et al. ............................ 252/500

FOREIGN PATENT DOCUMENTS 16305  1/1980  European Pat. Off. .
23595  2/1981  European Pat. Off. .

OTHER PUBLICATIONS

"Black Phosphorus", *Hackh's Chemical Dictionary*, 9th Edition, 1969, p. 515.
J. Chem. Phys. 71(3), Aug. 1979, pp. 1506–1507.

*Primary Examiner*—Josephine Barr
*Attorney, Agent, or Firm*—Keil & Witherspoon

[57] ABSTRACT

A process for the preparation of electrically conductive polymers, having conductivities greater than $10^{-2}$ S/cm, wherein from 0.1 to 95% by weight of black phosphorus and from 0.5 to 25% by weight of sodium, potassium, rubidium or cesium or of an amide of these, preferably in tetrahydrofuran, dimethoxyglycol, nitromethane or methylene chloride (the molar ratio of alkali metal or amide to organic compound preferably being from 1:1 to 1:5) are added to an organic polymer chosen from the group comprising the polyphenylenes, heteropolyphenylenes and polyacetylenes, in the absence of moisture and of oxygen. The electrically conductive polymers obtained can be used in the electrical industry for the production of solar cells, for conversion and fixing of radiation and for the production of electrical and magnetic switches, and can also be used for the antistatic treatment of plastics.

3 Claims, No Drawings

PREPARATION OF ELECTRICALLY CONDUCTIVE POLYMERIC SYSTEMS

The present invention relates to a process for the preparation of electrically conductive polymers having conductivities greater than $10^{-2}$ S/cm.

The preparation of organic polymers of the polyphenylene series by oxidative coupling is described in Macromolecular Syntheses Collective 1 (1979), 109–110, and in Naturwiss. 56 (1969), 308–313. Furthermore, R. Gehm and W. Kern, Macromol. Chem. 7 (1951), 46–61, have described the preparation of polyphenylenes by a stepwise polycondensation, giving particularly uniform para-linked methyl-substituted derivatives which are not contaminated by ortho-linked or metalinked polymers. The organic polymers of the heteropolyphenylene series differ from the polyphenylenes in that they have hetero-atoms, or groups containing hetero-atoms, between the aromatic ring systems. These polymers are described, for example, in Macromolecular Synthesis 6 (1978), 45–48. The preparation of organic polymers of the polyacetylene series by polymerizing acetylene is also known and is described, for example, by Hatano in J. Chem. Soc. Japan, Ind. Chem. Sect. 65 (1962), 723 et seq., and by D. J. Berets et al., Trans. Farad. Soc. 64 (1968), 823 et seq. Additionally, a more recent publication, by H. Shirakawa et al., J. Chem. Soc., Chem. Commn. (1977), 578–580, describes the polymerization of acetylene by means of Ziegler catalysts, to give polyacetylene. The said methods give products which are completely insoluble in conventional solvents and are obtained as black, amorphous to partially crystalline materials. The polymers amenable to the process of the present invention also include the materials obtained by the method described in Ber. Bunsenges. Phys. Chem. 68 (1964), 558–567.

It is an object of the present invention to convert the conventional organic polymers chosen from the group comprising the polyphenylenes, heteropolyphenylenes or polyacetylenes, by means of additives, into electrically conductive polymers, having conductivities greater than $10^{-2}$ S/cm, and in addition to stabilize them greatly against oxidative degradation, and increase their processability, and range of applications, substantially.

We have found that this object is achieved, according to the invention, by adding to the organic polymers, chosen from the group comprising the polyphenylenes, heteropolyphenylenes and polyacetylenes, in the absence of moisture and of oxygen, from 0.1 to 95% by weight, based on the organic polymer, of black phosphorus, and from 0.5 to 25% by weight, based on the organic polymer, sodium, potassium, rubidium or cesium or their amides. In a preferred method, the Na, K, Rb, Cs or amides of these are added in tetrahydrofuran, dimethoxyglycol, nitromethane or methylene chloride, in each case in a molar ratio of the former component to the latter component of from 1:1 to 1:50, preferably from 1:2 to 1:3.

The electrical conductivities are measured in S/cm at 30° C., using the method of F. Beck, loc. cit. The electrical conductivities of the novel conductive polymers are greater than $10^{-2}$ S/cm.

Using the process according to the invention, from 0.1 to 95% by weight, based on the weight of the polymer, of black phosphorus, and from 0.5 to 25% by weight, based on the weight of polymer, of an alkali metal or of an amide thereof, is added to the organic polymers.

The additives are incorporated in the absence of moisture (water) and of oxygen (air) and the process is therefore preferably carried out under a noble gas-argon atmosphere, eg. argon. If desired, an auxiliary fluid such as tetrahydrofuran, dimethoxyglycol, nitromethane or methylene chloride is employed, which is stripped off, after incorporation of the additive, under reduced pressure at below 30° C.

Increases in the electrical conductivity by several orders of magnitude can be achieved by means of the additives stated. The initial conductivity of the organic polymers is less than $10^{-12}$ S/cm, but after incorporation of the additives according to the invention the conductivities are greater than $10^{-2}$ S/cm.

The electrically conductive polymeric systems prepared according to the invention and having conductivities greater than $10^{-2}$ S/cm may be used for the antistatic treatment of plastics, for the production of solar cells, for conversion and fixing of radiation, and for the production of electrical and magnetic switches. The addition of the alkali metals or of their amides and of black phosphorus results in n-conductors (cf. J. Chem. Education 46 (1969), No. 2, 82).

In the Examples which follow, parts are parts by weight and percentages are mole percentages.

EXAMPLES 1 TO 7

In each case, the additive in question is added to 10 parts of an organic polymer under an argon atmosphere, with exclusion of moisture. The electrical conductivity is measured by the method of F. Beck, loc. cit.

TABLE

| Example No. | Organic polymer parts | Black phosphorus parts | Additive nature and amount in mole % | | Conductivity, in S/cm, at 30° C. | |
|---|---|---|---|---|---|---|
| | | | | | without additive | with additive |
| 1 | 10 polyacetylene described by Shirakawa[1] | 1 | Na | 0.5 | $10^{-10}$ | $6.5 \times 10^{+2}$ |
| 2 | polyacetylene described by Shirakawa[1] | 0.5 | K | 0.5 | $10^{-10}$ | $3.0 \times 10^{+2}$ |
| 3 | polyacetylene described by Shirakawa[1] | 2 | Cs | 0.3 | $10^{-10}$ | $0.5 \times 10^{+2}$ |
| 4 | polyacetylene described by Shirakawa[1] | 2 | Na[3] | 0.2 | $10^{-10}$ | $0.8 \times 10^{+2}$ |
| 5 | polyacetylene described by Shirakawa[1] | 10 | Na[3] | 0.5 | $10^{-10}$ | $1.7 \times 10^{+2}$ |
| 6 | polyacetylene described by Shirakawa[1] | 10 | Na[3] | 1.0 | $10^{-10}$ | $4.5 \times 10^{+2}$ |
| 7 | polyacetylene described by Luttinger[2] | 1 | Na[3] | 0.5 | $10^{-10}$ | $0.2 \times 10^{+1}$ |
| 8 | polyacetylene described by Shirakawa[1] | 1 | Na[4] | 0.5 | $10^{-10}$ | $0.5 \times 10^{+1}$ |
| 9 | polyacetylene described by Shirakawa[1] | 1 | Na[4] | 0.7 | $10^{-10}$ | $0.9 \times 10^{+1}$ |
| 10 | polyacetylene described by Shirakawa[1] | 1 | Na[4] | 0.8 | $10^{-10}$ | $0.6 \times 10^{+2}$ |
| 11 | polyacetylene described by | 1 | Na[4] | 1.2 | $10^{-10}$ | $0.8 \times 10^{+1}$ |

TABLE-continued

| Example No. | Organic polymer parts | Black phosphorus parts | Additive nature and amount in mole % | Conductivity, in S/cm, at 30° C. without additive | with additive |
|---|---|---|---|---|---|
| Shirakawa[1] | | | | | |

[1] J. Chem. Soc., Chem. Commn. (1977), 578 et seq.
[2] J. Org. Chem. 29 (1964), 2,936 et seq.
[3] Na as Na amide, 2.5% strength in tetrahydrofuran
[4] Na in liquid NH₃

We claim:

1. A process for the preparation of electrically conductive polyacetylene polymers having conductivities greater than $10^{-2}$ S/cm, which polymers are substantially stable to oxygen degradation, wherein from 0.1 to 95% by weight of black phosphorus and from 0.5 to 25% by weight of sodium, potassium, rubidium or cesium or their amides, are added, in the absence of moisture and of oxygen, to polyacetylene, the percentages stated being based on the weight of the polymer.

2. The process of claim 1, wherein Na, K, Rb or Cs or their amides are added in tetrahydrofuran, dimethoxyglycol, nitromethane or methylene chloride, the molar ratio of the former component to the latter component being in each case from 1:1 to 1:5.

3. The process of claim 2, wherein the molar ratio of the former component to the latter component is from 1:2 to 1:3.

* * * * *